US010470313B1

(12) United States Patent
Phillips et al.

(10) Patent No.: US 10,470,313 B1
(45) Date of Patent: Nov. 5, 2019

(54) SOLDER BALL MODULE FOR CONTACT ASSEMBLY OF AN ELECTRICAL CONNECTOR

(71) Applicant: TE CONNECTIVITY CORPORATION, Berwyn, PA (US)

(72) Inventors: Michael John Phillips, Camp Hill, PA (US); Randall Robert Henry, Lebanon, PA (US); Michael Joseph Tryson, Spring Grove, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 16/025,530

(22) Filed: Jul. 2, 2018

(51) Int. Cl.
| | |
|---|---|
| *H05K 3/34* | (2006.01) |
| *H01R 12/72* | (2011.01) |
| *H05K 1/14* | (2006.01) |
| *H01R 12/55* | (2011.01) |
| *H01R 12/70* | (2011.01) |
| *H01R 13/514* | (2006.01) |
| *H01R 13/518* | (2006.01) |
| *H01R 13/6583* | (2011.01) |
| *H01R 43/02* | (2006.01) |
| *H01R 12/57* | (2011.01) |

(52) U.S. Cl.
CPC .......... *H05K 3/3426* (2013.01); *H01R 12/55* (2013.01); *H01R 12/707* (2013.01); *H01R 12/722* (2013.01); *H01R 13/514* (2013.01); *H05K 1/144* (2013.01); *H05K 3/3436* (2013.01); *H01R 12/57* (2013.01); *H01R 13/518* (2013.01); *H01R 13/6583* (2013.01); *H01R 43/0256* (2013.01); *H05K 2201/10189* (2013.01); *H05K 2203/041* (2013.01)

(58) Field of Classification Search
CPC .... H05K 3/3436; H01R 12/57; H01R 12/707; H01R 3/514; H01R 43/0256
See application file for complete search history.

(56) References Cited

U.S. PATENT DOCUMENTS

| 6,079,991 | A | 6/2000 | Lemke et al. |
| 6,139,336 | A | 10/2000 | Olson |
| 6,179,623 | B1 * | 1/2001 | Pei .......................... H01R 12/57 |
| | | | 439/70 |
| 6,186,816 | B1 * | 2/2001 | Lu ......................... H05K 7/1007 |
| | | | 439/342 |

(Continued)

FOREIGN PATENT DOCUMENTS

WO 2017053944 A1 3/2017

*Primary Examiner* — Tho D Ta

(57) ABSTRACT

A contact assembly includes a contact array having contacts with transition portions between mating and terminating portions with contact tails extending to tips. The contact assembly has a dielectric contact holder holding the transition portions. The contact assembly has a solder ball module defining a board interface to a host circuit board. The solder ball module has a gathering housing with contact channels extending between a top and a bottom receiving contact tails of corresponding contacts. The gathering housing has solder balls arranged at the bottom at each contact channel being electrically connected to the tips of the contact tails and being configured to be reflow soldered to circuits of the host circuit board to electrically connect the contacts to the host circuit board.

20 Claims, 9 Drawing Sheets

(56) References Cited

U.S. PATENT DOCUMENTS

| | | | | |
|---|---|---|---|---|
| 6,805,278 B1 * | 10/2004 | Olson | ................ | H01R 43/0256 |
| | | | | 228/180.22 |
| 6,869,292 B2 | 3/2005 | Johnescu et al. | | |
| 7,204,699 B2 * | 4/2007 | Stoner | ................ | H01R 13/6315 |
| | | | | 439/71 |
| 7,226,298 B1 * | 6/2007 | Minich | .................. | H01R 23/70 |
| | | | | 439/83 |
| 7,258,551 B2 * | 8/2007 | Minich | .................. | H01R 12/57 |
| | | | | 439/67 |
| 9,608,377 B1 * | 3/2017 | Phillips | .................. | G02B 6/001 |
| 2016/0013596 A1 | 1/2016 | Regnier et al. | | |

* cited by examiner

US 10,470,313 B1

SOLDER BALL MODULE FOR CONTACT ASSEMBLY OF AN ELECTRICAL CONNECTOR

BACKGROUND OF THE INVENTION

The subject matter herein relates generally to contact assemblies for electrical connectors.

Some communication systems utilize electrical connectors to interconnect various components of the system for data communication. Some known communication systems use pluggable modules, such as I/O modules, that are electrically connected to the electrical connector. Known communication systems provide electrical shielding, such as in the form of a receptacle cage surrounding the communication connector and the pluggable module to provide electrical shielding. However, conventional communication systems have performance problems, particularly when transmitting at high data rates. For example, at the interface between the electrical connector and the host circuit board, the communication system suffers from signal integrity issues. Conventional electrical connectors use press-fit, compliant pins (for example, eye-of-the-needle pins) to mechanically and electrically connect the electrical connector to the host circuit board. Such connections are difficult to impedance match at the footprint of the electrical connector, such as due to the changes in geometries at the interface and the length of the electrical connection between the pins and the plated vias, which reduces electrical performance.

A need remains for a communication system having a reliable electrical connection between the electrical connector and the host circuit board.

BRIEF DESCRIPTION OF THE INVENTION

In one embodiment, a contact assembly is provided including a contact array having contacts each having a transition portion extending between a mating portion and a terminating portion. The mating portion has a separable mating interface configured to be mated to a mating contact. The terminating portion has a contact tail extending to a tip. The contact assembly has a dielectric contact holder holding the transition portions of the contacts of the contact array. The contact assembly has a solder ball module defining a board interface of the contact assembly to a host circuit board. The solder ball module has a gathering housing extending between a top and a bottom. The gathering housing has contact channels extending between the top and the bottom receiving contact tails of corresponding contacts. The gathering housing has solder balls arranged at the bottom at each of the contact channels being electrically connected to the tips of the contact tails of corresponding contacts and being configured to be reflow soldered to circuits of the host circuit board to electrically connect the contacts to the host circuit board.

In another embodiment, an electrical connector is provided including a housing having a mating end and a mounting end. The housing has a shroud at the mating end defining a card slot configured to receive a circuit card. The mounting end is configured to be mounted to a host circuit board. A contact assembly is received in a contact chamber of the housing. The contact assembly includes a contact array having contacts each having a transition portion extending between a mating portion and a terminating portion. The mating portion has a separable mating interface arranged in the shroud at the card slot for mating with the circuit card. The terminating portion has a contact tail extending to a tip arranged at the mounting end. The contact assembly has a solder ball module defining a board interface of the contact assembly configured to be terminated to the host circuit board. The solder ball module has a gathering housing coupled to the housing at the mounting end. The gathering housing has contact channels extending between a top and a bottom receiving the contact tails of corresponding contacts. The gathering housing has solder balls arranged at the bottom at each of the contact channels. The solder balls are electrically connected to the tips of the contact tails of corresponding contacts and the solder balls are configured to be reflow soldered to circuits of the host circuit board to electrically connect the contacts to the host circuit board.

In a further embodiment, an electrical connector system is provided including a receptacle assembly having a cage configured to be mounted to a host circuit board. The cage has walls defining a cavity. The walls of the cage provide electrical shielding for the cavity. The cavity has a module channel configured to receive a pluggable module. An electrical connector is received in the cavity for interfacing with the pluggable module. The electrical connector is configured to be electrically connected to the host circuit board. The electrical connector includes a housing having a mating end and a mounting end. The housing has a shroud at the mating end defining a card slot configured to receive a circuit card of the pluggable module. The mounting end is configured to be mounted to the host circuit board. A contact assembly is received in a contact chamber of the housing. The contact assembly includes a contact array having contacts each having a transition portion extending between a mating portion and a terminating portion. The mating portion has a separable mating interface arranged in the shroud at the card slot for mating with the circuit card. The terminating portion has a contact tail extending to a tip arranged at the mounting end. The contact assembly has a solder ball module defining a board interface of the contact assembly configured to be terminated to the host circuit board. The solder ball module has a gathering housing coupled to the housing at the mounting end. The gathering housing has contact channels extending between a top and a bottom receiving the contact tails of corresponding contacts. The gathering housing has solder balls arranged at the bottom at each of the contact channels. The solder balls are electrically connected to the tips of the contact tails of corresponding contacts and the solder balls are configured to be reflow soldered to circuits of the host circuit board to electrically connect the contacts to the host circuit board.

DETAILED DESCRIPTION OF THE INVENTION

Figure 1:
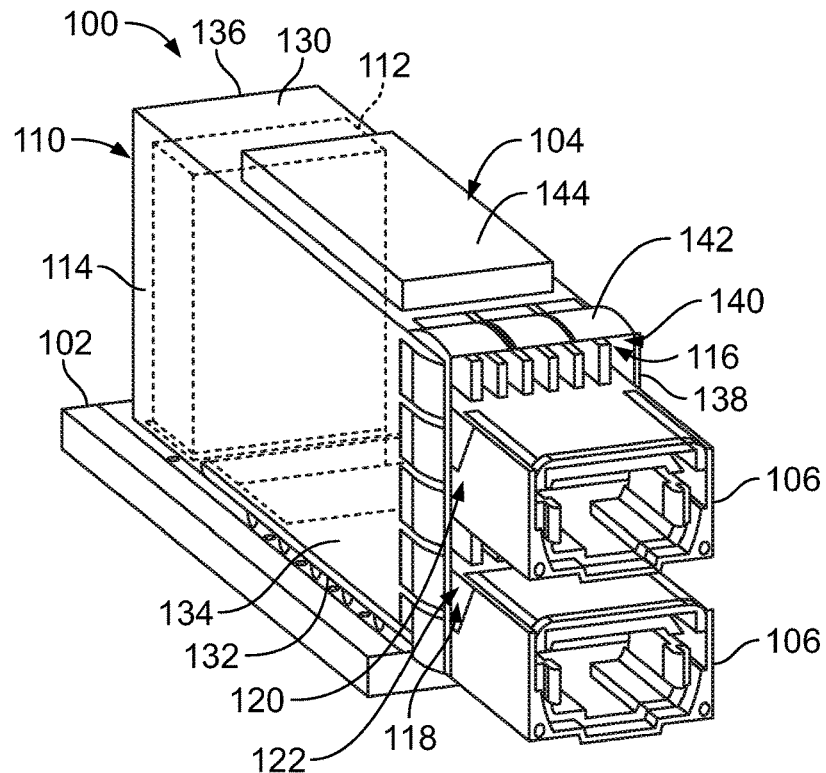
FIG. 1 is a front perspective view of a communication system having a receptacle connector assembly in accordance with an exemplary embodiment.

FIG. 1 is a front perspective view of a communication system 100 formed in accordance with an exemplary embodiment. The communication system includes a host circuit board 102 and a receptacle connector assembly 104 mounted to the host circuit board 102. Pluggable modules 106 are configured to be electrically connected to the receptacle connector assembly 104. The pluggable modules 106 are electrically connected to the host circuit board 102 through the receptacle connector assembly 104.

In an exemplary embodiment, the receptacle connector assembly 104 includes a receptacle cage 110 and an electrical connector 112 adjacent the receptacle cage 110. For example, in the illustrated embodiment, the electrical connector 112 is received in the receptacle cage 110. In other various embodiments, the electrical connector 112 may be located rearward of the receptacle cage 110. In various embodiments, the receptacle cage 110 is enclosed and provides electrical shielding for the electrical connector 112. The pluggable modules 106 are loaded into the receptacle cage 110 and are at least partially surrounded by the receptacle cage 110. In an exemplary embodiment, the receptacle cage 110 is a shielding, stamped and formed cage member that includes a plurality of shielding walls 114 that define one or more module channels for receipt of corresponding pluggable modules 106. In other embodiments, the receptacle cage 110 may be open between frame members to provide cooling airflow for the pluggable modules 106 with the frame members of the receptacle cage 110 defining guide tracks for guiding loading of the pluggable modules 106 into the receptacle cage 110.

In the illustrated embodiment, the receptacle cage 110 constitutes a stacked cage member having an upper module channel 116 and a lower module channel 118. The receptacle cage 110 has upper and lower module ports 120, 122 that open to the module channels 116, 118 that receive the pluggable modules 106. Any number of module channels may be provided in various embodiments. In the illustrated embodiment, the receptacle cage 110 includes the upper and lower module channels 116, 118 arranged in a single column, however, the receptacle cage 110 may include multiple columns of ganged module channels 116, 118 in alternative embodiments (for example, 2×2, 3×2, 4×2, 4×3, etc.). The receptacle connector assembly 104 is configured to mate with the pluggable modules 106 in both stacked module channels 116, 118. Optionally, multiple electrical connectors 112 may be arranged within the receptacle cage 110, such as when multiple columns of module channels 116, 118 are provided.

In an exemplary embodiment, the walls 114 of the receptacle cage 110 include a top wall 130, a bottom wall 132, and sidewalls 134 extending between the top wall 130 and the bottom wall 132. The bottom wall 132 may rest on the host circuit board 102. In other various embodiments, the receptacle cage 110 may be provided without the bottom wall 132. Optionally, the walls 114 of the receptacle cage 110 may include a rear wall 136 and a front wall 138 at the front of the receptacle cage 110. The module ports 120, 122 are provided in the front wall 138. The walls 114 define a cavity 140. For example, the cavity 140 may be defined by the top wall 130, the bottom wall 132, the sidewalls 134, the rear wall 136 and the front wall 138. Other walls 114 may separate or divide the cavity 140 into the various module channels 116, 118. For example, the walls 114 may include one or more divider walls between the upper and lower module channels 116, 118. In various embodiments, the walls 114 may include a separator panel between the upper and lower module channels 116, 118. The separator panel may form a space between the upper and lower module channels 116, 118, such as for airflow, for a heat sink, for routing light pipes, or for other purposes.

In an exemplary embodiment, the receptacle cage 110 may include one or more gaskets 142 at the front wall 138 for providing electrical shielding for the module channels 116, 118. For example, the gaskets 142 may be configured to electrically connect with the pluggable modules 106 received in the corresponding module channels 116, 118. The gaskets 142 may be provided at the module ports 120, 122.

In an exemplary embodiment, the receptacle connector assembly 104 may include one or more heat sinks 144 for dissipating heat from the pluggable modules 106. For example, the heat sink 144 may be coupled to the top wall 130 for engaging the upper pluggable module 106 received in the upper module channel 116. The heat sink 144 may extend through an opening in the top wall 130 to directly engage the pluggable module 106. Other types of heat sinks may be provided in alternative embodiments. Optionally, the receptacle connector assembly 104 may include one or more heat sinks for engaging the lower pluggable module 106 in the lower module channel 118. For example, the lower heat sink may be provided in the separator panel between the upper and lower module channels 116, 118.

In an exemplary embodiment, the electrical connector 112 is received in the cavity 140, such as proximate to the rear wall 136. However, in alternative embodiments, the electrical connector 112 may be located behind the rear wall 136 exterior of the receptacle cage 110 and extend into the cavity 140 to interface with the pluggable module(s) 106. In an exemplary embodiment, a single electrical connector 112 is used to electrically connect with the pair of stacked pluggable modules 106 in the upper and lower module channels 116, 118. In alternative embodiments, the communication system 100 may include discrete, stacked electrical connectors 112 (for example, an upper electrical connector and a lower electrical connector) for mating with the corresponding pluggable modules 106.

In an exemplary embodiment, the pluggable modules 106 are loaded through the front wall 138 to mate with the electrical connector 112. The walls 114 of the receptacle cage 110 provide electrical shielding around the electrical connector 112 and the pluggable modules 106, such as around the mating interfaces between the electrical connector 112 and the pluggable modules 106.

Figure 2:
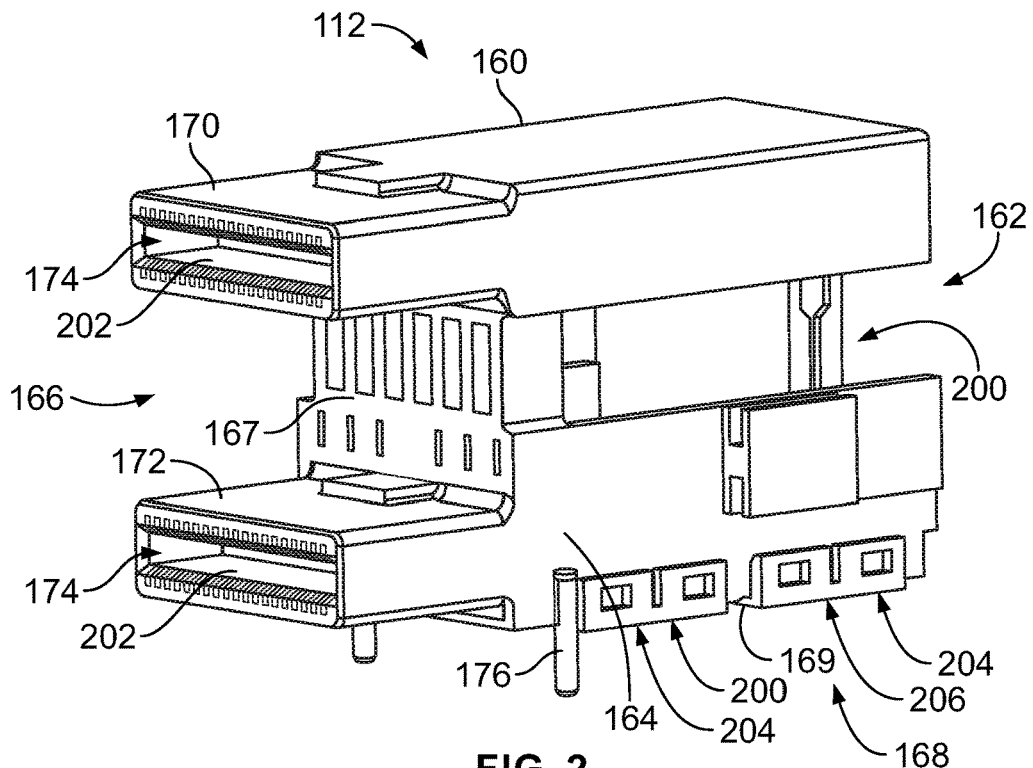
FIG. 2 is a front perspective view of an electrical connector of the receptacle connector assembly in accordance with an exemplary embodiment.

FIG. 2 is a front perspective view of the electrical connector 112 in accordance with an exemplary embodiment. The electrical connector 112 includes a housing 160 holding one or more contact assemblies 200 in a contact chamber 162 of the housing 160. The housing 160 is defined by a body portion 164 having a mating end 166, such as at a front 167 of the body portion 164, and mounting end 168, such as at a bottom of the housing 160. The body portion 164 may be closed forward of the contact chamber 162. The contact chamber 162 may be open at the rear and/or the bottom to receive the contact assemblies 200. The body portion 164 may be molded from a dielectric material, such as a plastic material, to form the housing 160. The housing 160 may be open at the bottom or the rear to receive the contact assembly 200.

Upper and lower shrouds 170 and 172 extend from the body portion 164 to define a stepped mating face. The shrouds 170, 172 are extension portions at the front of the housing 160. For a single port cage member, the electrical connector 112 may only include a single shroud 172. Mating slots 174, such as circuit card receiving slots, are provided in each of the shrouds 170, 172 to receive mating components, such as plug connectors, card edges of circuit cards of the corresponding pluggable modules 106 (shown in FIG. 1), or another type of mating component. A plurality of contacts 202 are exposed within the mating slots 174 for mating with contact pads on the card edge of the corresponding pluggable module 106. The contacts 202 are configured to be electrically connected to the host circuit board 102. In an exemplary embodiment, the contacts 202 are electrically connected to the host circuit board 102 through a solder ball module 204 at a board interface 206 of the contact assembly 200. For example, solder balls of the solder ball module 204 may be soldered to ends of the contacts 202 and then the solder balls may be reflow soldered to the host circuit board 102. The solder balls are surface mounted to the host circuit board 102 at a surface of the host circuit board 102, rather than being press fit into plated vias in the host circuit board as is typical of conventional electrical connectors. The contacts 202 of the contact assembly 200 may be overmolded leadframes in various embodiments. Rather than directly coupling the contacts 202 to the host circuit board 102, the contacts 202 are routed to the solder ball module 204 and terminated to solder balls, which may be easily surface mounted to the host circuit board 102 by a reflow soldering process.

Figure 3:
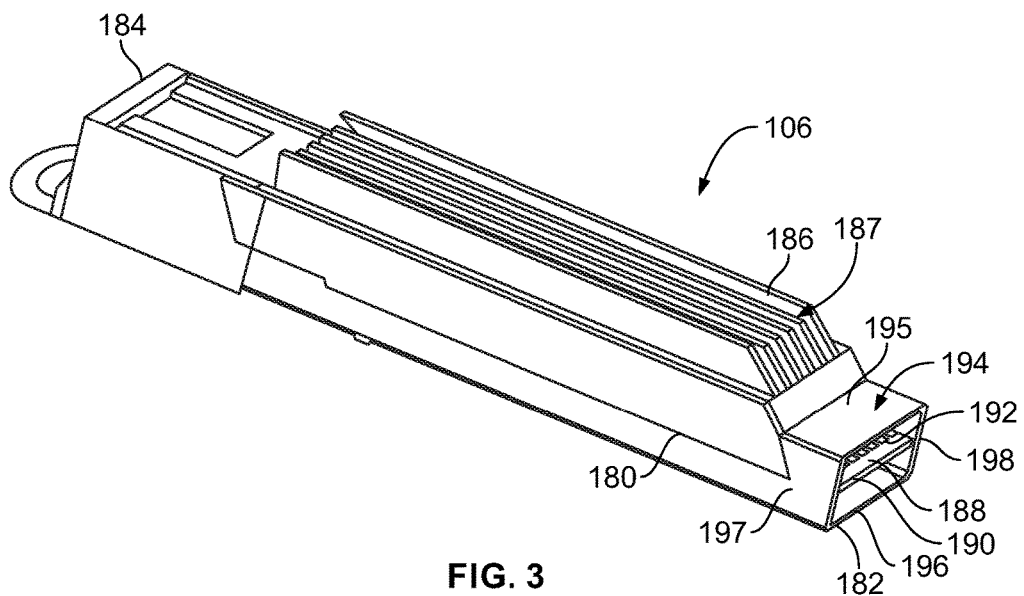
FIG. 3 is a rear perspective view of a pluggable module of the communication system in accordance with an exemplary embodiment.
Figure 4:
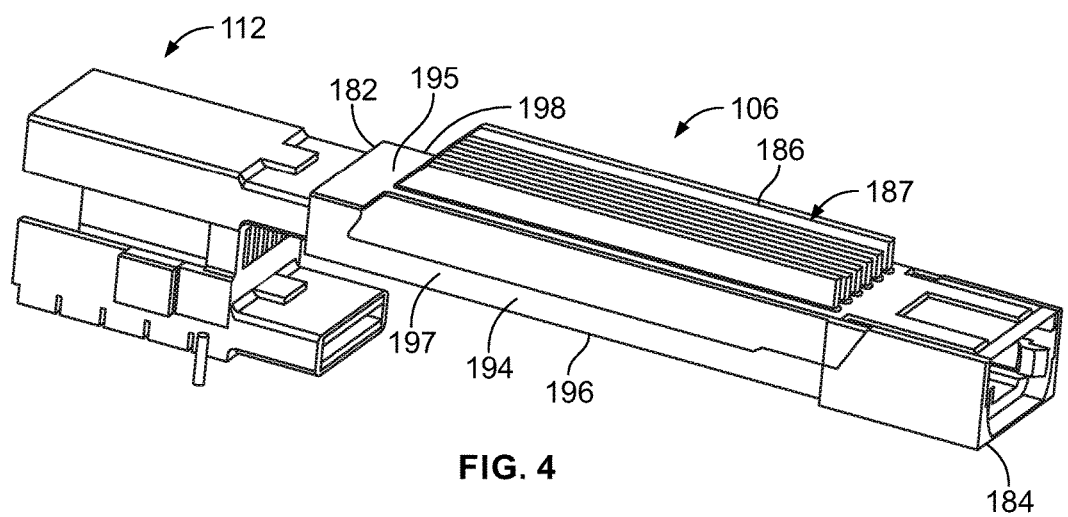
FIG. 4 is a front perspective view of the pluggable module coupled to the electrical connector.

FIG. 3 is a rear perspective view of the pluggable module 106 in accordance with an exemplary embodiment. FIG. 4 is a front perspective view of the pluggable module 106 coupled to the electrical connector 112. The pluggable module 106 has a pluggable body 180, which may be defined by one or more shells. The pluggable body may be thermally conductive and/or may be electrically conductive, such as to provide EMI shielding for the pluggable module 106. The pluggable body 180 includes a mating end 182 and an opposite front end 184. The mating end 182 is configured to be inserted into the corresponding module channel 116 or 118 (shown in FIG. 1). The front end 184 may be a cable end having a cable extending therefrom to another component within the system.

The pluggable module 106 includes a module circuit board 188 that is configured to be communicatively coupled to the electrical connector 112 (shown in FIG. 2). The module circuit board 188 may be accessible at the mating end 182. The module circuit board 188 has a mating edge 190 (shown in FIG. 3) and mating contacts 192 at the mating edge 190 configured to be mated with the electrical connector 112, such as to the contacts 202 of the electrical connector 112. Optionally, the mating pads 192 may be provided on both sides of the module circuit board 188. The mating pads 192 may be signal pads, ground pads, power pads, and the like. The module circuit board 188 may include components, circuits and the like used for operating and or using the pluggable module 106. For example, the module circuit board 188 may have conductors, traces, pads, electronics, sensors, controllers, switches, inputs, outputs, and the like associated with the module circuit board 188, which may be mounted to the module circuit board 188, to form various circuits.

The pluggable module 106 includes an outer perimeter defining an exterior 194 of the pluggable body 180. The exterior 194 extends between the mating end 182 and the front end 184 of the pluggable module 106. In an exemplary embodiment, the pluggable body 180 provides heat transfer for the module circuit board 188, such as for the electronic components on the module circuit board 188. For example, the module circuit board 188 is in thermal communication with the pluggable body 180 and the pluggable body 180 transfers heat from the module circuit board 188. In an exemplary embodiment, the pluggable body 180 includes a plurality of heat transfer fins 186 along at least a portion of the outer perimeter of the pluggable module 106. For example, in the illustrated embodiment, the fins 186 are provided along an end 195 (for example, the top); however the fins 186 may additionally or alternatively be provided along the sides 197, 198 and/or the opposite end 196 (for example, the bottom). The fins 186 transfer heat away from the main shell of the pluggable body 180, and thus from the module circuit board 188 and associated components. The fins 186 are separated by gaps 187 that allow airflow or other cooling flow along the surfaces of the fins 186 to dissipate the heat therefrom. In the illustrated embodiment, the fins 186 are parallel plates that extend lengthwise; however the fins 186 may have other shapes in alternative embodiments, such as cylindrical or other shaped posts. In other various embodiments, the ends 195 and/or 196 may be planar rather have the fins 186.

Figure 5:
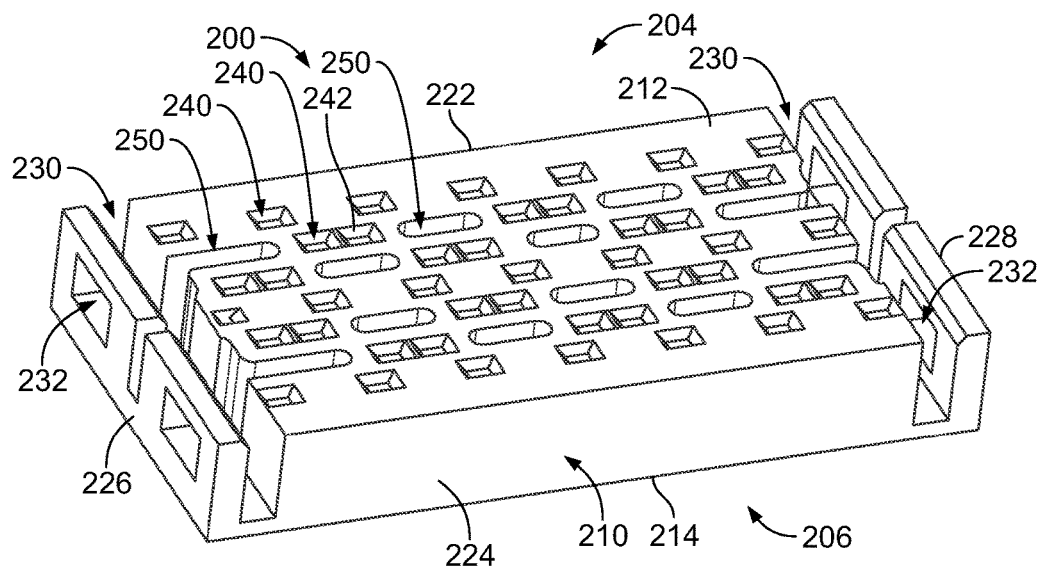
FIG. 5 is a top perspective view of a solder ball module of the receptacle connector assembly in accordance with an exemplary embodiment.
Figure 6:
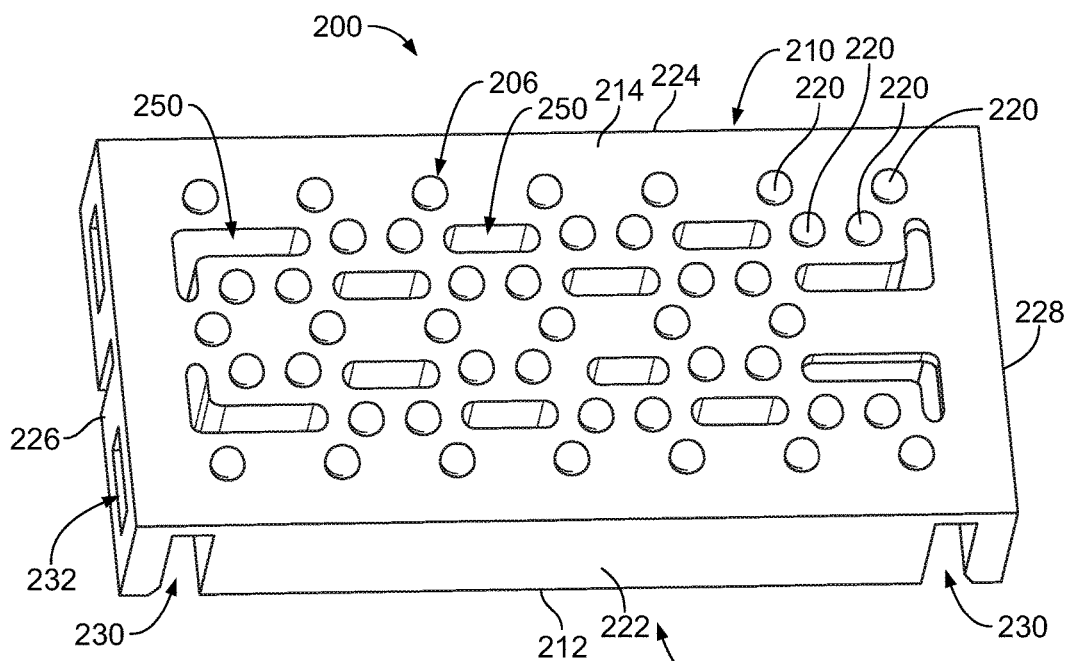
FIG. 6 is a bottom perspective view of the solder ball module in accordance with an exemplary embodiment.

FIG. 5 is a top perspective view of the solder ball module 204 in accordance with an exemplary embodiment. FIG. 6 is a bottom perspective view of the solder ball module 204 in accordance with an exemplary embodiment. The solder ball module 204 includes a gathering housing 210 extending between a top 212 and a bottom 214. The solder ball module 204 includes a plurality of solder balls 220 arranged at the bottom 214. The solder balls 220 are configured to be electrically connected to corresponding contacts 202 of the contact assembly 200 (shown in FIG. 2).

The gathering housing 210 includes a front 222 and a rear 224 extending between the top 212 and the bottom 214. The gathering housing 210 includes a first side 226 and a second side 228 extending between the top 212 and the bottom 214. In an exemplary embodiment, the gathering housing 210 includes housing channels 230 at the first and second sides 226, 228 that receive portions of the housing 160 (shown in FIG. 2) to secure the gathering housing 210 to the housing 160. In an exemplary embodiment, the gathering housing 210 includes mounting features 232 at the first and second sides 226, 228 for mounting the gathering housing 210 to the housing 160. For example, the mounting features 232 may be latches or clips. In the illustrated embodiment, the mounting features 232 are latching openings configured to receive latches of the housing 160 to secure the gathering housing 210 to the housing 160. Other types of mounting features may be provided in alternative embodiments.

The gathering housing 210 includes contact channels 240 extending between the top 212 and the bottom 214. The contact channels 240 receive corresponding contacts 202 of the contact assembly 200. Optionally, the contact channels 240 may include chamfered lead-ins 242 at the top 212 for loading the contacts 202 into the gathering housing 210. The solder balls 220 are provided at the bottom 214 at each of the corresponding contact channels 240 for electrical connection to the corresponding contacts 202. The contacts 202 are configured to interface with the solder balls 220 within the contact channels 240, such as proximate to the bottom 214. For example, the contacts 202 may pass vertically straight through the gathering housing 210 to interface with the solder balls 220 at the bottom 214. The solder balls 220 define the electrical interface with the host circuit board 102 at the board interface 206. The solder balls 220 electrically connect the contacts 202 to the host circuit board 102 at the board interface 206. For example, the solder balls 220 may be reflow soldered to the host circuit board 102 to create an electrical connection between the contacts 202 and the host circuit board 102.

The pattern or positioning of the contact channels 240 corresponds to the patterning or positioning of the contact pads on the host circuit board 102 and/or the arrangements of the contacts 202. For example, the contact channels 240 may be arranged in rows and/or columns. Various contact channels 240 may be arranged in pairs and/or separated by other contact channels 240. Various contact channels 240 may define signal contact channels configured to receive signal contacts and various contact channels 240 may define ground contact channels configured to receive ground contacts.

In an exemplary embodiment, the gathering housing 210 includes impedance control cavities 250 extending between the top 212 and the bottom 214. Optionally, the impedance control cavities 250 may extend entirely through the gathering housing 210 from the top 212 to the bottom 214. Alternatively, the impedance control cavities 250 may be open at the top 212 or open at the bottom 214. The impedance control cavities 250 are positioned relative to the contact channels 240 to control the impedance of signals transmitted by the contacts 202 through the gathering housing 210. For example, the impedance control cavities 250 control the impedance of signals transmitted by the contacts 202 proximate to the host circuit board 102, such as in the vicinity of the board interface 206. In the illustrated embodiment, the impedance control cavities 250 are provided between pairs of signal contact channels and are positioned between signal contact channels and various ground contact channels.

The impedance control cavities 250 introduce air in the vicinity of the board interface 206 where the contacts 202 interface with the host circuit board 102. As such, the impedance may be increased at the interface between the contact assembly 200 and the host circuit board 102 by the inclusion of the impedance control cavities 250. The size, shape and positioning of the impedance control cavities 250 relative to the contact channels 240 may affect the impedance of the signals transmitted through the gathering housing 210 by the contacts 202. For example, increasing the number of impedance control cavities 250, the size of the impedance control cavities 250 or the proximity of the impedance control cavities 250 to the contact channels 240 may affect the impedance of the signals transmitted by the contacts 202 through the gathering housing 210. Additionally, the relative spacing between the signal contacts and the relative spacing between the signal contacts and the ground contacts may affect other electrical characteristics of the signals transmitted through the gathering housing 210.

Figure 7:
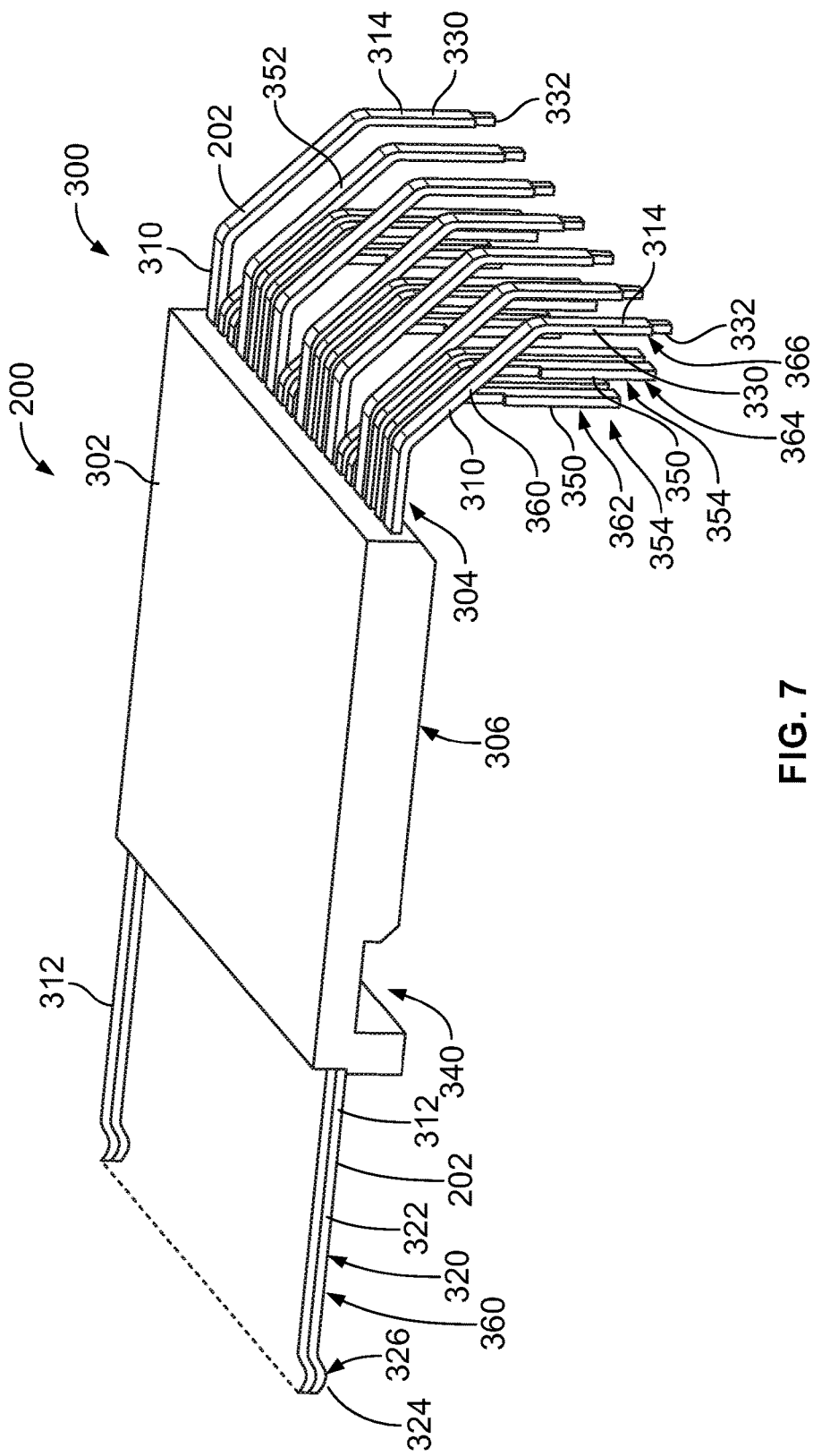
FIG. 7 illustrates a portion of a contact assembly of the electrical connector in accordance with an exemplary embodiment.

FIG. 7 illustrates a portion of the contact assembly 200 in accordance with an exemplary embodiment. FIG. 7 shows an upper portion of the contact assembly 200 in accordance with an exemplary embodiment. In various embodiments, the contact assembly 200 may include a lower portion similar to the upper portion having a similar arrangement of contacts 202, such as is shown in other various Figures.

The contact assembly 200 includes a contact array 300 having a plurality of the contacts 202. In an exemplary embodiment, the contact assembly 200 includes a contact holder 302 holding the contacts 202 of the contact array 300. In various embodiments, the contact array 300 includes a leadframe 304 and the contact holder 302 includes a dielectric frame 306 overmolded over the leadframe 304. Optionally, the contact array 300 may be formed from multiple leadframes 304 (not shown). Optionally, the contact holder 302 may be formed from multiple dielectric frames 306 (not shown). For example, in various embodiments, the contact assembly 200 may include an upper leadframe having a corresponding upper dielectric frame and a corresponding lower leadframe having a lower dielectric frame where the upper leadframe has the corresponding contacts 202 in a corresponding upper row and the lower leadframe has the corresponding contacts 202 in a corresponding lower row.

In an exemplary embodiment, each contact 202 has a transition portion 310 extending between a mating portion 312 and a terminating portion 314. The mating portion 312 is configured to be mated with the module circuit board 188 of the pluggable module 106 (both shown in FIG. 3). The terminating portion 314 is configured to be received in the solder ball module 204 (shown in FIGS. 5 and 6) and electrically connected to the solder balls 220 (shown in FIG. 6). The transition portion 310 is held by the contact holder 302. For example, the dielectric frame 306 is overmolded over the transition portion 310. Optionally, a section of the transition portion 310 may extend rearward of the dielectric frame 306 and/or a section of the transition portion 310 may extend forward of the dielectric frame 306.

The mating portion 312 is located forward of the dielectric frame 306 of the contact holder 302. The terminating portion 314 is located rearward of the dielectric frame 306 of the contact holder 302. In an exemplary embodiment, the mating portion 312 extends generally perpendicular to the terminating portion 314. For example, the mating portion 312 may extend generally horizontally and the terminating portion 314 may extend generally vertically. The transition portion 310 transitions between the mating portion 312 and the terminating portion 314. For example, the terminating portion 314 may have one or more bends to transition between the mating portion 312 and the terminating portion 314. In the illustrated embodiment, the transition portion 310 includes two approximately 45° bends to transition between the mating portion 312 and the terminating portion 314.

The mating portion 312 includes a spring beam 320 cantilevered forward of the dielectric frame 306 of the contact holder 302. The spring beam 320 is configured to be loaded into the housing 160, such as into the upper shroud 170 or the lower shroud 172 (shown in FIG. 2) along the mating slot 174 for interfacing with the module circuit board 188 of the pluggable module 106. In an exemplary embodiment, the spring beam 320 includes a mating arm 322 and a mating finger 324 at the distal end of the mating arm 322. The mating finger 324 is curved and defines a separable mating interface 326 of the contact 202. The spring beam 320 is deflectable when mated with the module circuit board 188. In an exemplary embodiment, the contacts 202 of the contact assembly 200 may form a card slot between the upper row of the contacts 202 and a lower row (not shown) of the contacts 202 configured to receive the module circuit board 188 to engage the mating pads 192 on both the top and the bottom of the module circuit board 188.

The terminating portion 314 includes a contact tail 330 extending from the transition portion 310 to a tip 332. The tip 332 is configured to be directly mated with the corresponding solder ball 220 (shown in FIG. 6). The tip 332 is provided at the distal end of the contact tail 330. In an exemplary embodiment, the tip 332 is provided in line with the contact tail 330. For example, the contact tail 330 extends vertically and the tip 332 is provided at the bottom of the contact tail 330. In the illustrated embodiment, the contact 202 does not include a foot or pad bent at 90° at the bottom or distal end of the contact 202 but rather is a linear or straight tail portion. In an exemplary embodiment, the tip 332 is narrower than the contact tail 330. As such, when heating the contact 202 and the solder ball 220 during the reflow process, the solder of the solder ball 220 may be applied to the tip 332 rather than being drawn along other portions of the contact tail 330 by a capillary heating action. The heat is focused at the tip 332 because the tip 332 is narrower than the contact tail 330 and thus heats more quickly to focus the solder reflow at the tip 332.

In an exemplary embodiment, the contact holder 302 holds the relative positions of the contacts 202. For example, the contact holder 302 holds the spacing of the contacts 202 along the transition portions 310. In an exemplary embodiment, the contact holder 302 is formed in place around the contacts 202. For example, the dielectric frame 306 is overmolded around the leadframe 304. The size and shape of the dielectric frame 306 may be selected to control the impedance of the signals transmitted by the contacts 202 through the transition portions 310. The material selected for the dielectric frame 306 may affect the impedance of the signals transmitted through the transition portions 310. Optionally, the dielectric frame 306 may include windows, pockets or openings therethrough to introduce air in and around various contacts 202, such as signal contacts. In an exemplary embodiment, the dielectric frame 306 includes a pocket 340 exposing one or more of the contacts 202. For example, in the illustrated embodiment, the pocket 340 is provided at the bottom of the dielectric frame 306. The pocket 340 may expose ground contacts and may receive one or more electrically grounded components to electrically common the ground contacts within the pocket 340.

In an exemplary embodiment, the contacts 202 of the contact assembly 200 include signal contacts 350 and ground contacts 352. In an exemplary embodiment, the signal contacts 350 are arranged in pairs 354. The ground contacts 352 are provided between the pairs 354 of signal contacts 350 such that the contacts 202 have a ground-signal-signal-ground pattern. Other arrangements of the contacts 202 may be provided in alternative embodiments. In the illustrated embodiment, the mating portions 312 are arranged in a single row 360. In the illustrated embodiment, the terminating portions 314 are arranged in three rows 362, 364, 366. For example, the first row 362 may be a row of signal contacts 350, the second row 364 may be a row of signal contacts 350 and the third row 366 may be a row of ground contacts 352. Other arrangements of the contacts 202 are possible in alternative embodiments. The transition portions 310 are shaped differently to position the terminating portions 314 in the different rows 362, 364, 366. For example, the bends are provided at different locations and/or the segments have different lengths between the bends.

Figure 8:
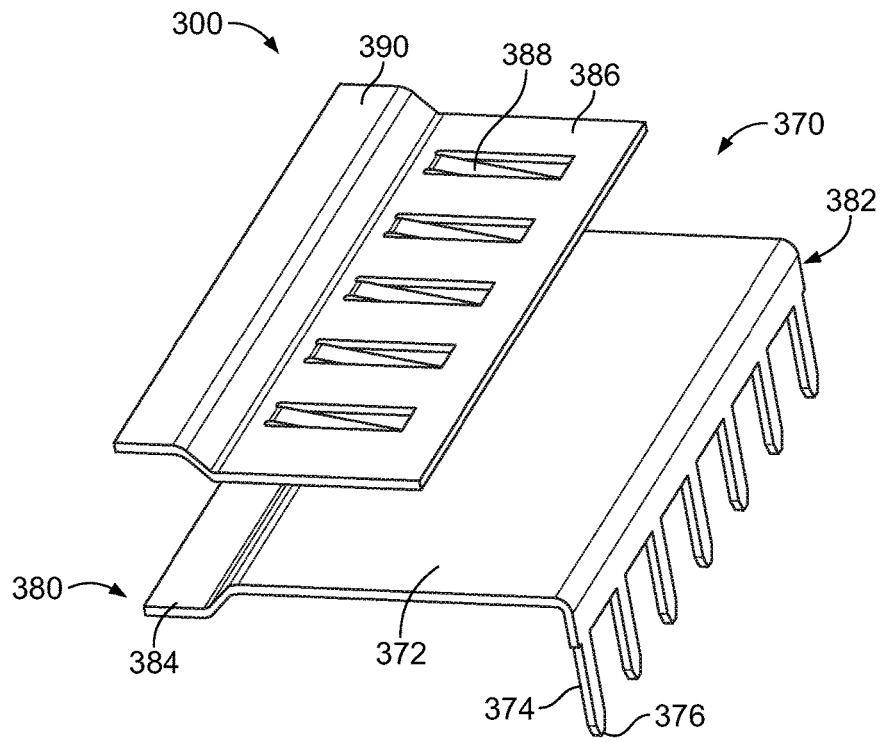
FIG. 8 is a top perspective view of a ground shield of a contact array of the contact assembly in accordance with an exemplary embodiment.

FIG. 8 is a top perspective view of a ground shield 370 of the contact array 300 of the contact assembly 200 in accordance with an exemplary embodiment. The ground shield 370 is configured to be located between an upper row of contacts and a lower row of contacts within the contact array 300. The ground shield 370 provides electrical shielding between the upper and lower rows of signal contacts 350. The ground shield 370 electrically connects the ground contacts 352.

The ground shield 370 includes a plate 372 and ground tails 374 extending from the plate 372 to tips 376. The ground tails 374 are configured to be received in corresponding contact channels 240 in the gathering housing 210 (shown in FIG. 5). The tips 376 are configured to be terminated to corresponding solder balls 220 (shown in FIG. 6). The ground shield 370 extends between a front 380 and a rear 382. The ground tails 374 are provided at the rear 382.

In an exemplary embodiment, the ground shield 370 includes a commoning bar 384 at the front 380. The commoning bar 384 extends from the plate 372. The commoning bar 384 is configured to engage a plurality of the ground contacts 352 of the contact array 300. In the illustrated embodiment, the commoning bar 384 is stepped downward from the plate 372 and is configured to be electrically commoned with ground contacts 352 in a lower row of ground contacts 352 that are located below the ground shield 370. In an exemplary embodiment, the commoning bar 384 may be planar. Alternatively, the commoning bar 384 may include deflectable spring fingers configured to engage corresponding ground contacts 352.

In an exemplary embodiment, the ground shield 370 includes an upper plate 386 extending from the plate 372. For example, the upper plate 386 may be configured to be coupled to the plate 372. The upper plate 386 may be compressed against the plate 372. Optionally, the upper plate 386 and/or the plate 372 may include spring beams 388 configured to be spring biased against the other of the plate 372 or the upper plate 386 to electrically connect the plate 372 and the upper plate 386 when compressed. In other various embodiments, the upper plate 386 may be welded or otherwise electrically connected to the plate 372. In other various embodiments, the upper plate 386 may be formed integral with the plate 372, such as being stamped and formed with the plate 372.

The upper plate 386 includes a commoning bar 390 configured to be electrically connected to a plurality of the ground contacts 352. For example, the commoning bar 390 is stepped upward from the upper plate 386 to engage ground contacts 352 in an upper row within the contact array 300. Optionally, the commoning bar 390 may be planar. In other various embodiments, the commoning bar 390 may include spring fingers extending therefrom configured to engage the ground contacts 352.

Figure 9:
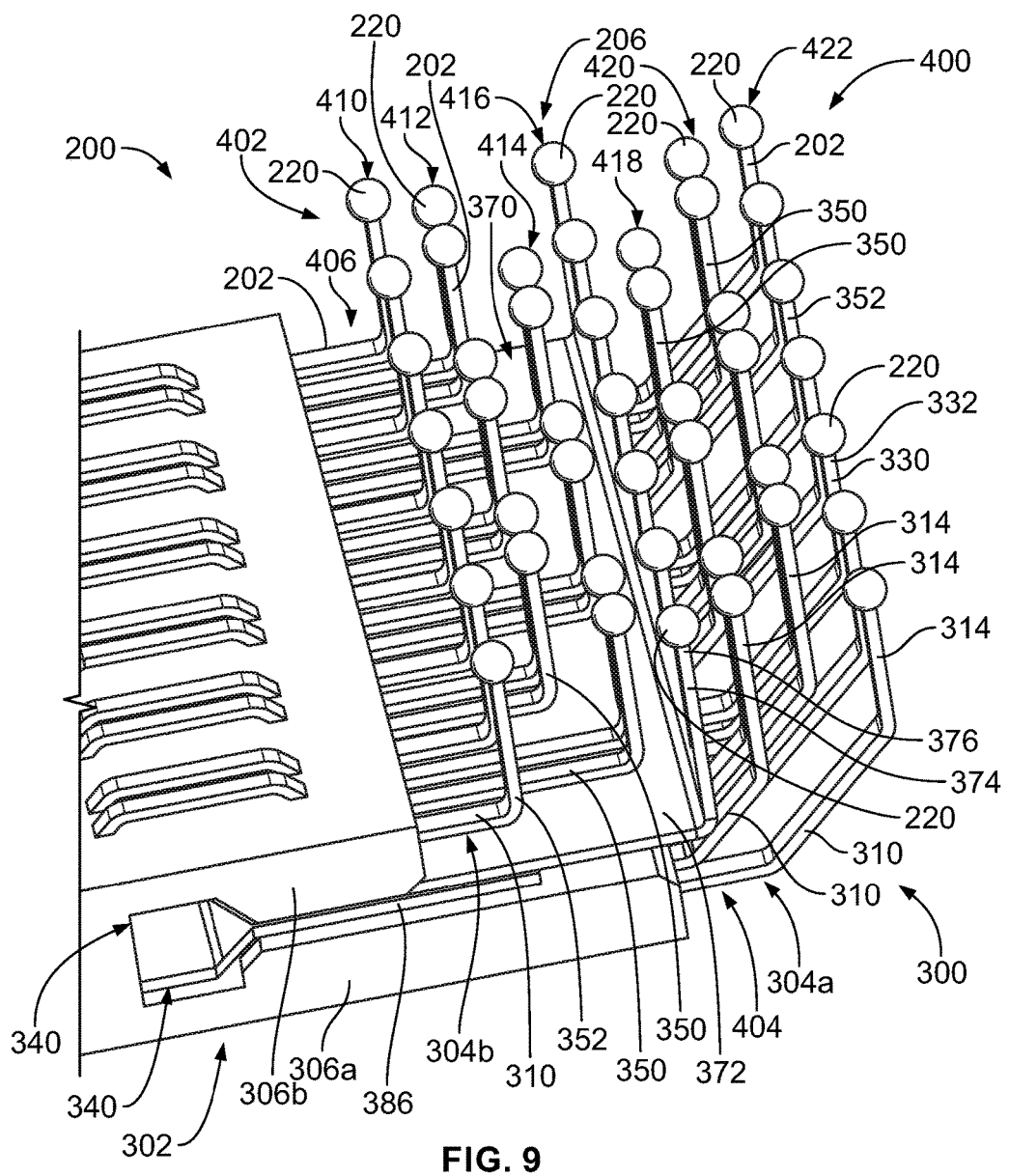
FIG. 9 is a bottom perspective view of a portion of the contact assembly in accordance with an exemplary embodiment.

FIG. 9 is a bottom perspective view of a portion of the contact assembly 200 in accordance with an exemplary embodiment. FIG. 9 illustrates the contact assembly 200 without the gathering housing 210 (shown in FIG. 10) to illustrate the termination of the solder balls 220 to the contacts 202. In the illustrated embodiment, the contact array 300 includes an upper set 400 of the contacts 202 and a lower set 402 of the contacts 202. The mating portions 312 of the contacts 202 in the upper set are arranged in an upper row 404 and the mating portions 312 of the contacts 202 in the lower set 402 are arranged in a lower row 406.

The ground shield 370 is located between the upper row 404 of contacts 202 and the lower row 406 of contacts 202. For example, the plate 372 and the upper plate 386 are located between the transition portions 310 thereof and the ground tails 374 are located between the terminating portions 314 thereof.

Solder balls 220 are provided at the tips 332 of the contact tails 330 of the signal contacts 350 and the ground contacts 352. The solder balls 220 are also provided at the tips 376 of the ground tails 374 of the ground shield 370. The grounds provide electrical shielding between various signals. In the illustrated embodiment, the signals are arranged in pairs. In the illustrated embodiment, at the board interface 206, the solder balls 220 are arranged from front to rear as a first ground row 410, a first signal row 412, a second signal row 414, a second ground row 416, a third signal row 418, a fourth signal row 420, and a third ground row 422. Other arrangements are possible in alternative embodiments.

In an exemplary embodiment, the contact array 300 includes an upper leadframe 304a and a lower leadframe 304b and the contact holder 302 includes an upper dielectric frame 306a and a lower dielectric frame 306b. The ground shield 370 is located between the upper dielectric frame 306a and the lower dielectric frame 306b. The ground shield 370 extends into the pockets 340 in the dielectric frames 306 to interface with the ground contacts 352. The ground shield 370 may be electrically connected to each of the ground contacts 352 in the upper row 404 and each of the ground contacts 352 in the lower row 406 in an exemplary embodiment.

Figure 10:
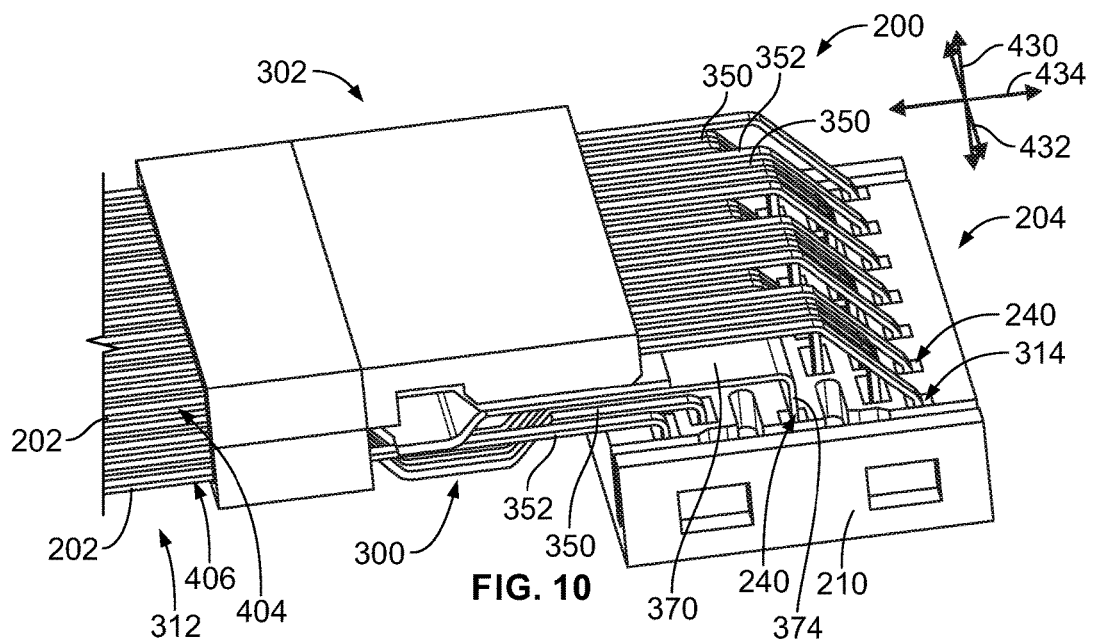
FIG. 10 is a top perspective view of a portion of the contact assembly in accordance with an exemplary embodiment.
Figure 11:
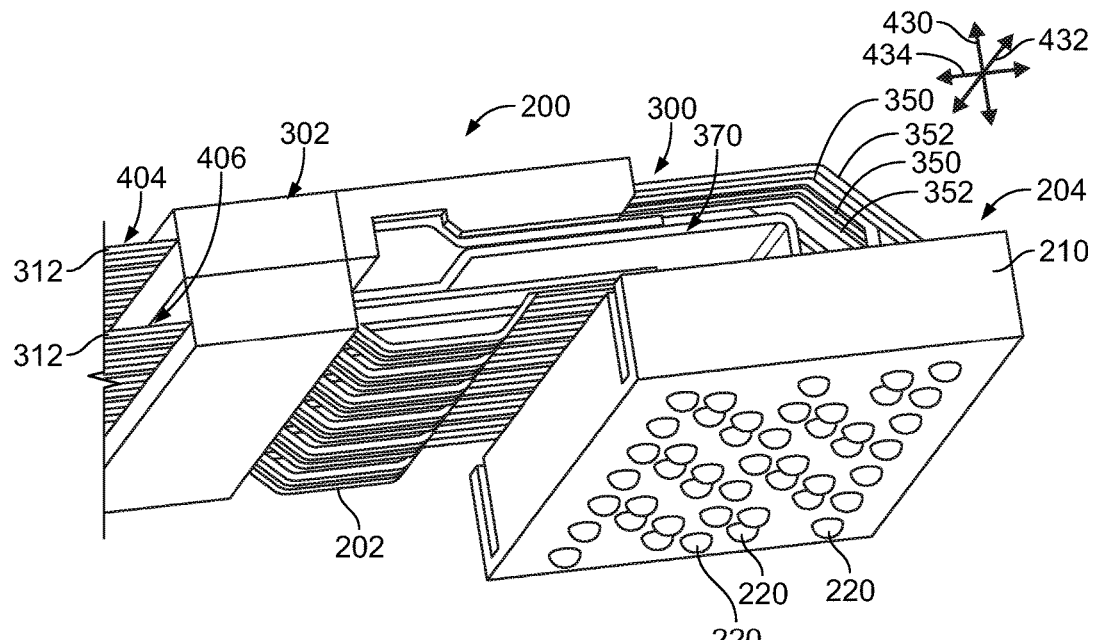
FIG. 11 is a bottom perspective view of a portion of the contact assembly in accordance with an exemplary embodiment.
Figure 12:
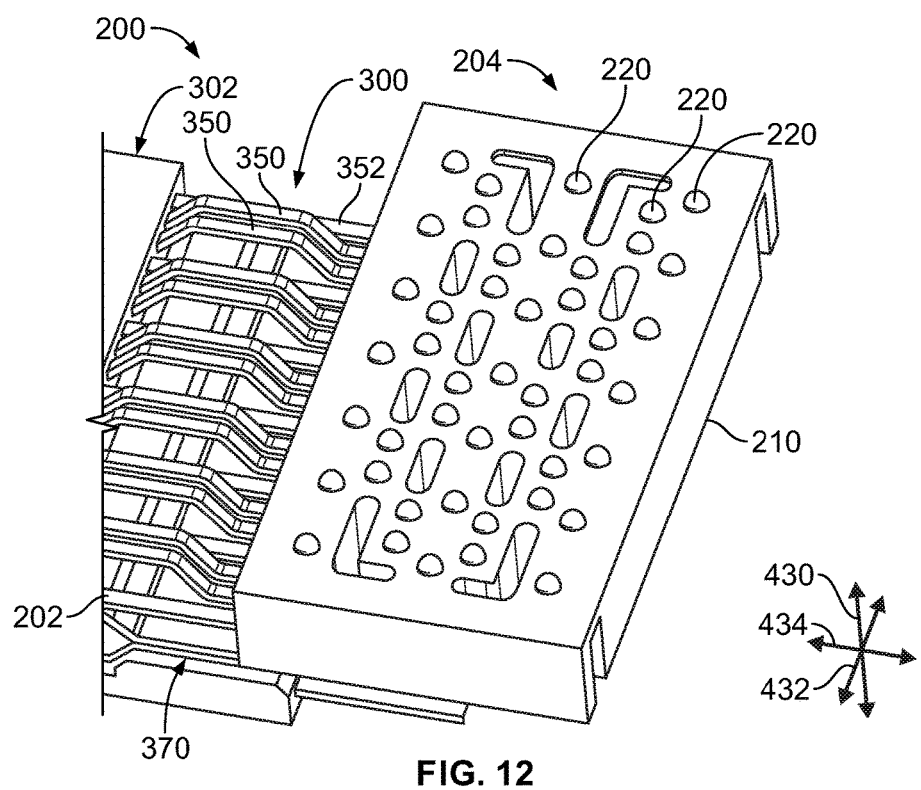
FIG. 12 is a bottom perspective view of a portion of the contact assembly in accordance with an exemplary embodiment.
Figure 13:
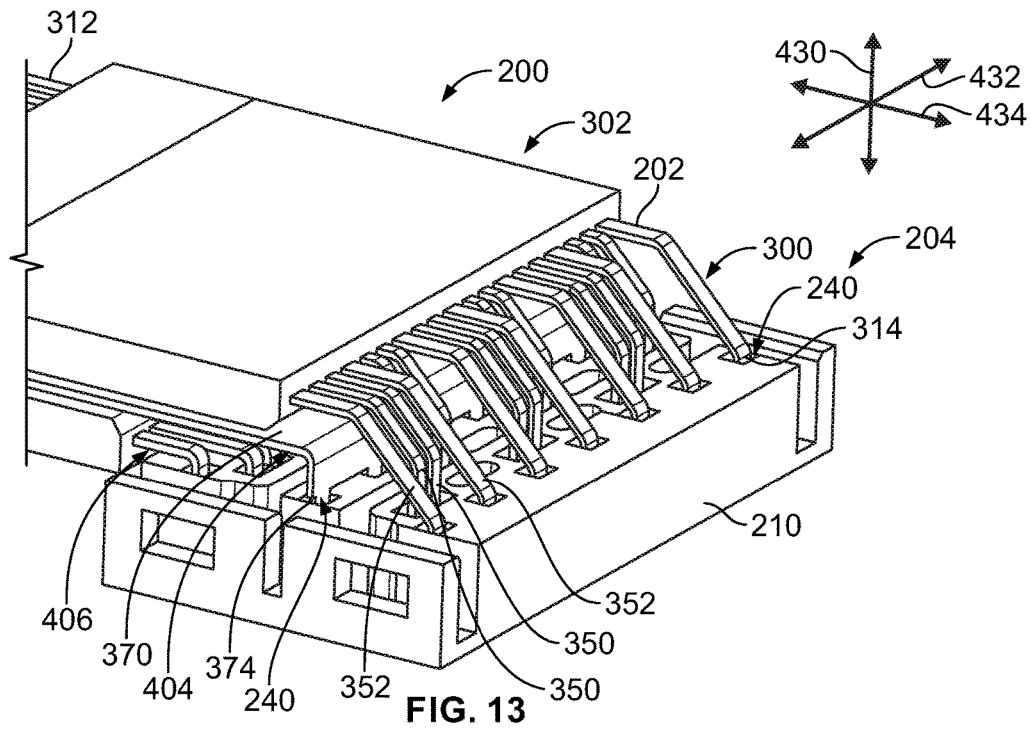
FIG. 13 is a rear perspective view of a portion of the contact assembly in accordance with an exemplary embodiment.

FIG. 10 is a top perspective view of a portion of the contact assembly 200 in accordance with an exemplary embodiment. FIG. 11 is a bottom perspective view of a portion of the contact assembly 200 in accordance with an exemplary embodiment. FIG. 12 is a bottom perspective view of a portion of the contact assembly 200 in accordance with an exemplary embodiment. FIG. 13 is a rear perspective view of a portion of the contact assembly 200 in accordance with an exemplary embodiment.

The contact array 300 is coupled to the solder ball module 204. The contact holder 302 holds the contacts 202 of the contact array 300. The ground shield 370 is provided between the upper row 404 of contacts 202 and the lower row 406 of contacts 202. The terminating portions 314 of the signal contacts 350 and the ground contacts 352 extend into corresponding contact channels 240 in the gathering housing 210. The ground tails 374 of the ground shield 370 extend into corresponding contact channels 240 in the gathering housing 210.

In an exemplary embodiment, the contact holder 302 holds the relative positions of the contacts 202, such as the spacing of the contacts 202, along an elevation axis 430, a lateral axis 432 and a transverse axis 434. The elevation axis 430, the lateral axis 432 and the transverse axis 434 are mutually perpendicular axes. In an exemplary embodiment, the contact holder 302 positions the mating portions 312 for loading into the housing 160, such as for mating with the module circuit board 188. The gathering housing 210 holds the relative positions of the contacts 202, such as the contact tails 330, along the elevation axis 430, the lateral axis 432 and the transverse axis 434. In an exemplary embodiment, the gathering housing 210 positions the contact tails 330 for termination with the solder balls 220.

Figure 14:
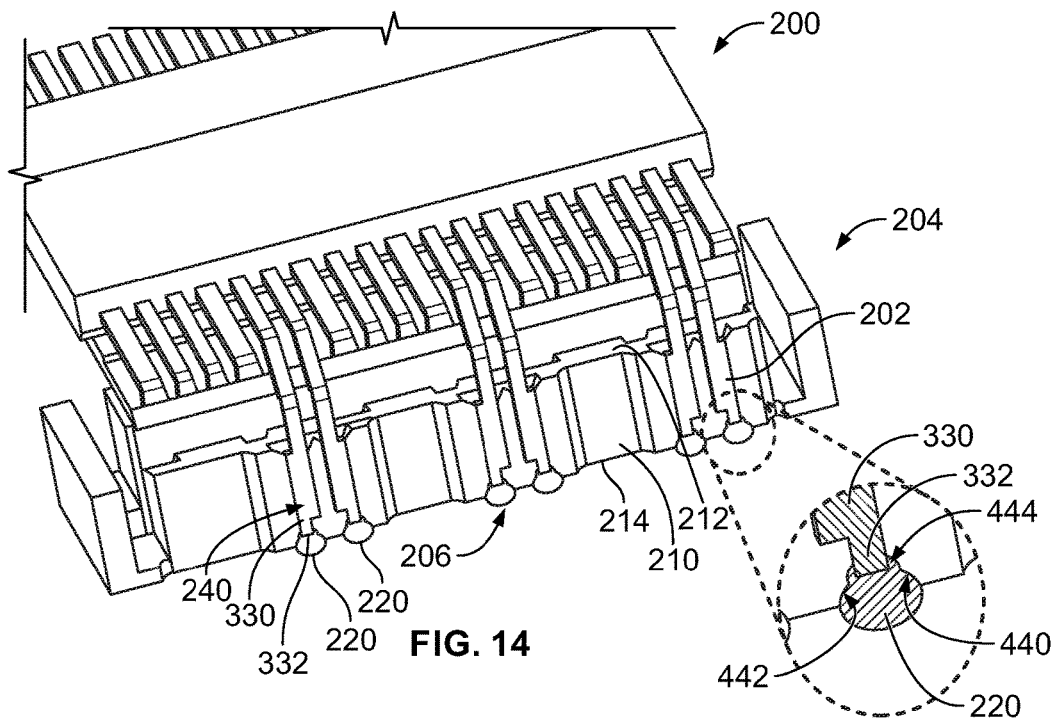
FIG. 14 is a cross-sectional view of a portion of the contact assembly in accordance with an exemplary embodiment.

FIG. 14 is a cross-sectional view of a portion of the contact assembly 200 in accordance with an exemplary embodiment. The contact tails 330 are loaded into the contact channels 240 of the gathering housing 210 for electrical connection with the solder balls 220. In an exemplary embodiment, the solder balls 220 are coplanar at the board interface 206 of the solder ball module 204 along the bottom 214 of the gathering housing 210. The contact tails 330 extend perpendicular to the bottom 214 and the host circuit board 102 from the solder balls 220 between the bottom 214 and the top 212 of the gathering housing 210.

In an exemplary embodiment, the tips 332 of the contact tails 330 directly engage the solder balls 220. Optionally, the tips 332 may be located proximate to the bottom 214 to engage the solder balls 220. In the illustrated embodiment, the tips 332 are located above the bottom 214 of the gathering housing 210 to electrically connect with the solder balls 220. For example, in an exemplary embodiment, the gathering housing 210 includes solder ball pockets 440 at the bottom 214 that receive corresponding solder balls 220. The solder ball pockets 440 are associated with each corresponding contact channel 240. The solder ball pockets 440 may be sized and shaped to receive the preformed solder balls 220. For example, the solder ball pockets 440 may have a radius of curvature similar to the radius of curvature of the preformed solder balls 220. For example, the solder ball pockets 440 may be semi-spherical. The solder ball pockets 440 may have a depth 442 approximately equal to the radius of the solder balls 220. In other various embodiments, the depth 442 may be less than the radius of the solder balls 220 such that greater than half of the volume of the solder balls 220 is located exterior of the solder ball pocket 440. In an exemplary embodiment, the tip 332 extends proximate to or into the solder ball pocket 440 to interface with the solder ball 220.

In various embodiments, the gathering housing 210 includes solder ball relief pockets 444 between the contact channels 240 and the solder ball pockets 440 that receives solder of the solder balls 220 when the solder balls 220 are reflowed to locate the solder of the solder balls 220 around the contact tails 330 at the tips 332 of the contacts 202. For example, the solder ball relief pockets 444 may provide additional space for solder to flow around the tips 332. The solder filling the solder ball relief pockets 444 solidifies around the contact tips 330 to provide a solid joint of solder around the tip 332. For example, in lieu of connecting the solder at only the distal end of the tip 332, the solder ball relief pocket 444 may expose a length of the contact tails 330 along the tip 332 to allow some of the solder material to interface with the side of the contact tail 330 in addition to the end of the contact tail 330. A more robust mechanical and electrical interface may be achieved between the solder ball 220 and the contact 202 by the solder ball relief pocket 444 allowing some of the solder material to flow along the contact tail 330. The depth and size of the solder ball relief pocket 444 controls the amount of solder material allowed to flow along the contact tail 330 ensuring that enough solder material remains at the board interface 206 for soldering to the host circuit board 102.

Figure 15:
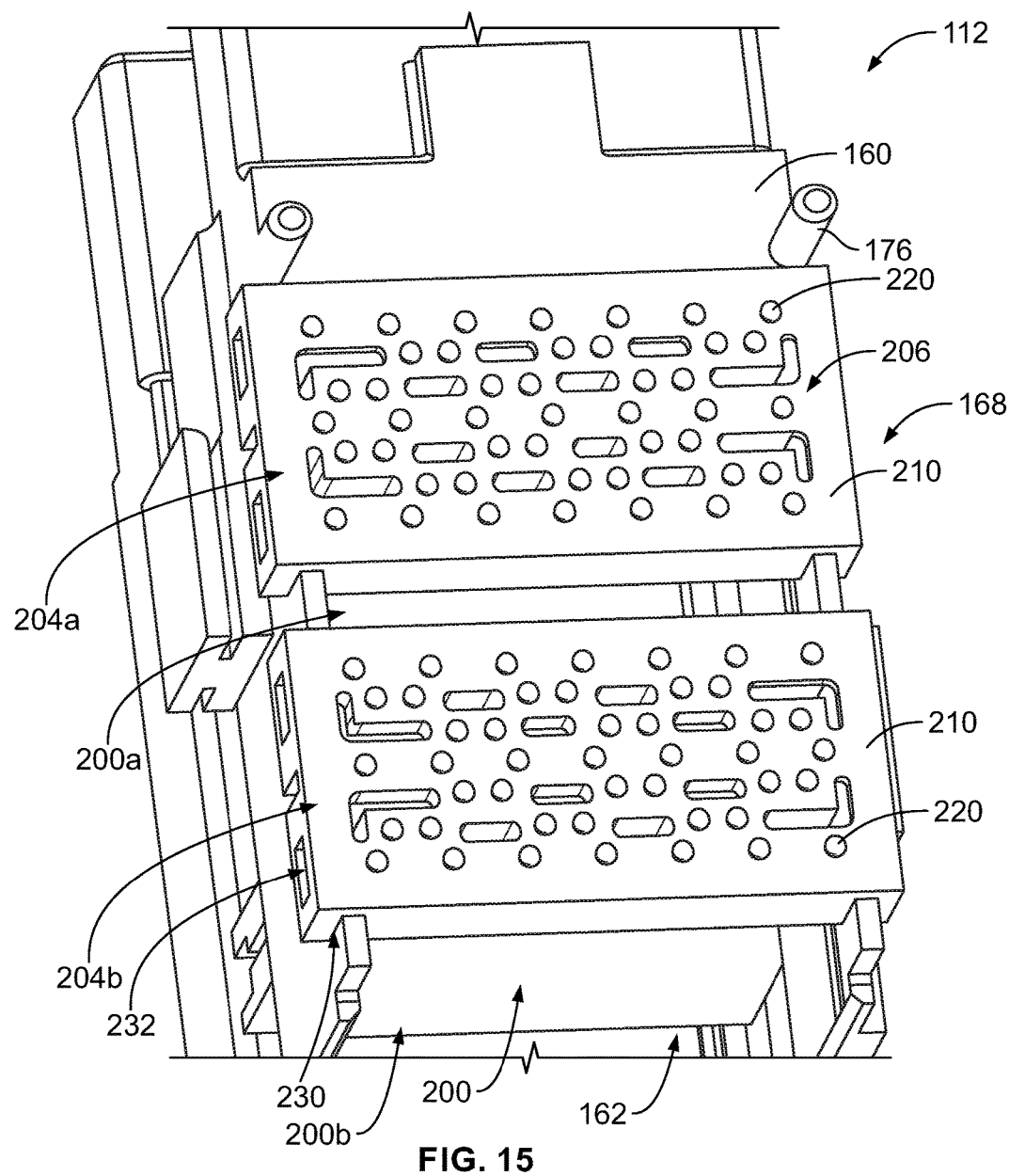
FIG. 15 is a bottom perspective view of a portion of the electrical connector showing a first contact assembly and a second contact assembly including a first solder ball module and a second solder ball module in accordance with an exemplary embodiment.

FIG. 15 is a bottom perspective view of a portion of the electrical connector 112 showing a first contact assembly 200a and a second contact assembly 200b including a first solder ball module 204a and a second solder ball module 204b coupled to the housing 160. The first solder ball module 204a is located forward of the second solder ball module 204b. The contact assemblies 200 are received in the contact chamber 162 of the housing 160. The walls of the housing 160 are received in housing channels 230 of the gathering housings 210. The mounting features 232 secure the gathering housings 210 to the housing 160. The board interfaces 206 are provided at the mounting end 168 of the electrical connector 112 for surface mounting to the host circuit board 102. The housing 160 includes locating features 176 for locating the electrical connector 112 relative to the host circuit board 102, which locates the solder balls 220 relative to the host circuit board 102 for surface mounting the solder balls 220 to the host circuit board 102. The host circuit board 102 may include signal and/or ground contact pads and the solder balls 220 may be reflow soldered to such contact pads during a reflow soldering process.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A contact assembly comprising:
   a contact array having contacts each having a transition portion extending between a mating portion and a terminating portion, the mating portion having a separable mating interface configured to be mated to a mating contact, the terminating portion having a contact tail extending to a tip, the contacts include signal contacts arranged in an upper row of contacts and a lower row of contacts, the contact array further comprising a ground shield between the upper row of contacts and the lower row of contacts, the ground shield having a plate and ground tails extending from the plate to tips;
   a contact holder holding the transition portions of the contacts of the contact array, the contact holder being dielectric; and
   a solder ball module defining a board interface of the contact assembly to a host circuit board, the solder ball module having a gathering housing extending between a top and a bottom, the gathering housing having contact channels extending between the top and the bottom receiving contact tails of corresponding contacts, the ground tails being received in corresponding contact channels in the gathering housing, the gathering housing having solder balls arranged at the bottom at each of the contact channels, the solder balls being electrically connected to the tips of the contact tails of corresponding signal contacts and the solder balls being terminated to corresponding tips of the ground tails, the solder balls being configured to be reflow soldered to circuits of the host circuit board to electrically connect the contacts to the host circuit board.

2. The contact assembly of claim 1, wherein the solder balls are coplanar at the board interface of the solder ball module along the bottom of the gathering housing.

3. The contact assembly of claim 1, wherein the contact tails extend perpendicular to the host circuit board from the solder balls between the bottom and the top of the gathering housing.

4. The contact assembly of claim 1, wherein the tips are located above the bottom of the gathering housing electrically connected to the solder balls.

5. The contact assembly of claim 1, wherein the tips are narrower than the contact tails.

6. The contact assembly of claim 1, wherein the gathering housing includes impedance control cavities between the top and the bottom positioned adjacent the contact channels to control the impedance of signals transmitted by the contacts.

7. The contact assembly of claim 1, wherein the contacts include signal contacts and ground contacts, the signal contacts being arranged in pairs carrying differential signals, the ground contacts being arranged between pairs of signal contacts.

8. The contact assembly of claim 1, wherein the contacts are arranged in at least one set, each set being a leadframe and overmolded by a dielectric frame forming the contact holder.

9. The contact assembly of claim 1, wherein the mating portions extend forward of the contact holder as spring beams in an upper row and a lower row forming a card slot therebetween configured to receive a circuit card having the mating contacts in an upper row of mating contacts and a lower row of mating contacts.

10. The contact assembly of claim 1, wherein the mating portions are oriented perpendicular to the terminating portions.

11. The contact assembly of claim 1, wherein the contacts include ground contacts and signal contacts, the plate of the ground shield directly engaging the ground contacts to electrically common the ground contacts.

12. The contact assembly of claim 1, wherein the contact channels position the contact tails along an elevation axis, a lateral axis and a transverse axis relative to each other for connection to the solder balls at the board interface, the elevation axis, the lateral axis and the transverse axis being mutually perpendicular axes.

13. The contact assembly of claim 1, wherein the gathering housing includes solder ball pockets associated with the contact channels at the bottom holding corresponding solder balls.

14. The contact assembly of claim 13, wherein the tips of the contacts extend to the solder ball pockets for interfacing with the solder balls.

15. The contact assembly of claim 13, wherein the gathering housing includes solder ball relief pockets between the contact channels and the solder ball pockets receiving solder of the solder balls when the solder balls are reflowed to locate the solder of the solder balls around the contact tails at the tips of the contacts.

16. An electrical connector comprising:
a housing having a mating end and a mounting end, the housing having a shroud at the mating end defining a card slot configured to receive a circuit card, the mounting end configured to be mounted to a host circuit board, the housing having a contact chamber; and
a contact assembly received in the contact chamber of the housing, the contact assembly includes a contact array having contacts each having a transition portion extending between a mating portion and a terminating portion, the mating portion having a separable mating interface arranged in the shroud at the card slot for mating with the circuit card, the terminating portion having a contact tail extending to a tip arranged at the mounting end, the contact assembly having a solder ball module defining a board interface of the contact assembly configured to be terminated to the host circuit board, the solder ball module having a gathering housing coupled to the housing at the mounting end, the gathering housing having contact channels extending between a top and a bottom receiving the contact tails of corresponding contacts, the gathering housing having solder balls arranged at the bottom at each of the contact channels, the solder balls being electrically connected to the tips of the contact tails of corresponding contacts and the solder balls being configured to be reflow soldered to circuits of the host circuit board to electrically connect the contacts to the host circuit board, the gathering housing includes impedance control cavities positioned adjacent all the contact channels to control the impedance of signals transmitted by the contacts.

17. The electrical connector of claim 16, wherein the shroud is a first shroud and the contact assembly is a first contact assembly, the housing having a second shroud at the mating end defining a second card slot configured to receive a second circuit card, the second shroud being stacked above the first shroud, the electrical connector further comprising a second contact assembly located rearward of and above the first contact assembly, the second contact assembly being received in the contact chamber of the housing, the second contact assembly includes a second contact array having second contacts each having a transition portion extending between a mating portion and a terminating portion, the mating portion having a separable mating interface arranged in the second shroud at the second card slot for mating with the second circuit card, the terminating portion having a contact tail extending to a tip arranged at the mounting end, the second contact assembly having a second solder ball module defining a board interface of the second contact assembly configured to be terminated to the host circuit board, the second solder ball module having a second gathering housing coupled to the housing at the mounting end, the second gathering housing having contact channels extending between a top and a bottom receiving the contact tails of corresponding second contacts, the second gathering housing having second solder balls arranged at the bottom at each of the contact channels, the second solder balls being electrically connected to the tips of the contact tails of corresponding second contacts and the second solder balls being configured to be reflow soldered to circuits of the host circuit board to electrically connect the second contacts to the host circuit board.

18. The electrical connector of claim 16, wherein the contact tails extend vertically through the contact channels to the bottom to the tips to engage the solder balls at the tips, the solder balls being coplanar at the board interface of the solder ball module along the bottom of the gathering housing.

19. The electrical connector of claim 16, wherein the contacts include signal contacts arranged in an upper row of contacts and a lower row of contacts, the contact array further comprising a ground shield between the upper row of contacts and the lower row of contacts, the ground shield having a plate and ground tails extending from the plate to tips, the ground tails being received in corresponding contact channels in the gathering housing and being terminated to corresponding solder balls at the tips of the ground tails.

20. An electrical connector system comprising:
a receptacle assembly having a cage configured to be mounted to a host circuit board, the cage having walls defining a cavity, the walls of the cage providing electrical shielding for the cavity, the cavity having a module channel configured to receive a pluggable module;
an electrical connector received in the cavity for interfacing with the pluggable module, the electrical connector configured to be electrically connected to the host circuit board, the electrical connector comprising:
a housing having a mating end and a mounting end, the housing having a shroud at the mating end defining a card slot configured to receive a circuit card of the pluggable module, the mounting end configured to be mounted to the host circuit board, the housing having a contact chamber; and
a contact assembly received in the contact chamber of the housing, the contact assembly includes a contact array having contacts each having a transition portion extending between a mating portion and a terminating portion, the mating portion having a separable mating interface arranged in the shroud at the card slot for mating with the circuit card, the terminating portion having a contact tail extending to a tip arranged at the mounting end, the contact assembly having a solder ball module defining a board interface of the contact assembly configured to be terminated to the host circuit board, the solder ball module having a gathering housing coupled to the housing at the mounting end, the gathering housing having contact channels extending between a top and a bottom receiving the contact tails of corresponding contacts, the gathering housing having solder balls arranged at the bottom at each of the contact channels, the solder balls being electrically connected to the tips of the contact tails of corresponding contacts and the solder balls being configured to be reflow soldered to circuits of the host circuit board to electrically connect the contacts to the host circuit board.

* * * * *